United States Patent [19]

Kim

[11] Patent Number: 4,997,774
[45] Date of Patent: Mar. 5, 1991

[54] METHOD FOR FABRICATING A DRAM CELL

[75] Inventor: Ki N. Kim, Anyang, Rep. of Korea

[73] Assignee: Samsung Semiconductor and Telecommunications Co., Ltd., Gifu, Rep. of Korea

[21] Appl. No.: 412,591

[22] Filed: Sep. 25, 1989

Related U.S. Application Data

[63] Continuation of Ser. No. 85,573, Aug. 14, 1987, abandoned.

[30] Foreign Application Priority Data

Aug. 22, 1986 [KR] Rep. of Korea ............... 86-6933

[51] Int. Cl.$^5$ .......................................... H01L 21/266
[52] U.S. Cl. ................................... 437/30; 437/52; 357/23.6
[58] Field of Search .................. 437/28, 29, 30, 52; 357/236

[56] References Cited

U.S. PATENT DOCUMENTS

| | | | |
|---|---|---|---|
| 4,164,751 | 8/1979 | Tasch, Jr. .................. | 357/41 |
| 4,268,950 | 5/1981 | Chatterjee et al. ............ | 437/52 |
| 4,352,236 | 10/1982 | McCollum ................... | 437/52 |
| 4,413,401 | 11/1983 | Klein et al. ................. | 437/52 |
| 4,432,006 | 2/1984 | Takei ....................... | 357/23.6 |
| 4,467,450 | 8/1984 | Kuo ......................... | 357/23.6 |
| 4,534,104 | 8/1985 | Dham ....................... | 437/52 |
| 4,543,594 | 9/1985 | Mohsen et al. ............... | 357/51 |
| 4,719,184 | 1/1988 | Cantarelli et al. ............ | 437/24 |

FOREIGN PATENT DOCUMENTS

| | | | |
|---|---|---|---|
| 59-161861 | 9/1984 | Japan ....................... | 357/23.6 |
| 60-9155 | 1/1985 | Japan ....................... | 357/23.6 |
| 62-238661 | 10/1987 | Japan ....................... | 357/23.6 |
| 81/02493 | 9/1981 | PCT Int'l Appl. ............ | 437/52 |

OTHER PUBLICATIONS

Rideout, IBM Tech. Disc. Bull., vol. 21, No. 9 (Feb., 1979), pp. 3823-3825.
Selective Node Dielectric Thinning of Semiconductor Dynamic Memory, IBM Tech. Disc. Bull., vol. 30, No. 3 (Aug., 1987), pp. 1294-1296.

Primary Examiner—Olik Chaudhuri
Assistant Examiner—George R. Fourson
Attorney, Agent, or Firm—Cushman, Darby & Cushman

[57] ABSTRACT

This invention is related to a method for fabricating a DRAM cell. This invention makes the capacitor electrode and the source of the transistor connect more easily using the lateral diffusion of another dopant having higher diffusivity and same impurity type, which is added to the first ion implantation for the first electrode of storage capacitor. According to this invention the storage capacitor electrode and the source of the transistor are connected successfully, and it is possible to reduce the resistance between the capacitor electrode and the drain of the transistor.

8 Claims, 3 Drawing Sheets

METHOD FOR FABRICATING A DRAM CELL

This is a continuation of application Ser. No. 07/085,573, filed Aug. 14, 1987, now abandoned.

TECHNICAL FIELD

This invention is related to a method for fabricating a DRAM (Dynamic Random Access Memory) cell, especially 1 transistor-1 capacitor DRAM cell.

BACKGROUND ART

The 1 capacitor-1 transistor memory cell is used for high packing density DRAM and the memory array using this cell is fabricated by the folded bit line method.

In the layout using the folded bit line method with 1 transistor cell, the transistor and the storage capacitor are placed side by side and between the transistor and the storage capacitor, a minifield oxidation area is grown and the source of said transistor is connected to the arsenic implanted layer on the silicon surface below said storage capacitor, which acts as the electrode of said capacitor.

However, in this method, the oxidation layer for the surface isolation layer of the first polysilicon overlapped on said capacitor area is formed at the same time as the minifield oxidation, and the lateral diffusion of said implanted arsenic under the minifield oxide on the silicon surface is used for the method of connection of the source of said transistor with the arsenic implanted layer which acts as the electrode of said capacitor. However, the doping concentration of said implanted arsenic may be lowered during the minifield oxidation due to the low diffusion coefficient of arsenic.

As a result, the large resistance between the capacitor electrode and the transistor causes the reduction of the margin of a DRAM supply voltage and a rapid decrease of refresh time, and it does not operate at high speed and at worst, said capacitor electrode and the transistor are disconnected in failure.

SUMMARY OF THE INVENTION

The purpose of this invention is the presentation of a method for fabricating a DRAM cell in which the storage capacitor electrode and the source of the transistor are connected successfully in spite of a minifield oxide layer.

Another purpose of this invention is the presentation of a method for fabricating a 1 transistor memory cell in which it is possible to reduce the resistance between the capacitor electrode and the source of the transistor.

In order to attain the purpose of this invention, this invention makes the capacitor electrode and the source of the transistor connect more readily using the lateral diffusion of another dopant having higher diffusinity and same impurity, which is added to the first ion implantation for the first electrode of the storage capacitor.

DESCRIPTION OF THE PREFERRED EMBODIMENTS

Detail explanation is followed with the figures.

Figure 1:
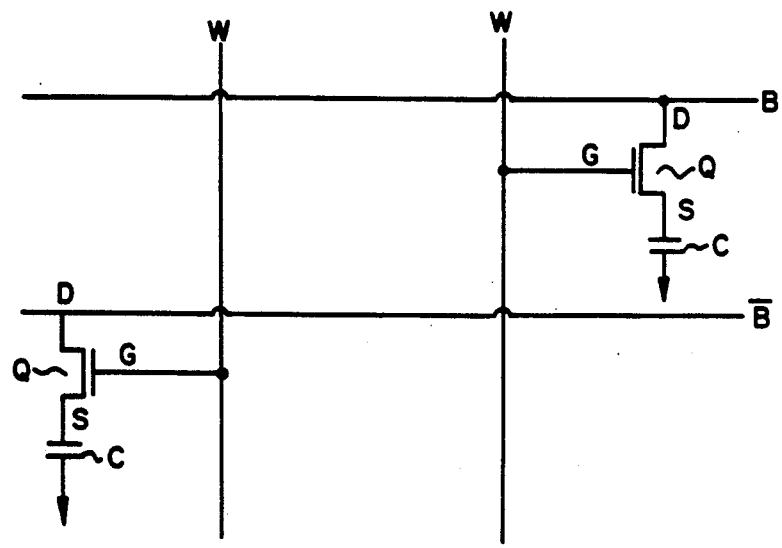
FIG. 1 shows the circuit diagram of 1 transistor cell array.

FIG. 1 shows the circuit diagram of a memory cell array in the folded bit line method.

Figure 2:
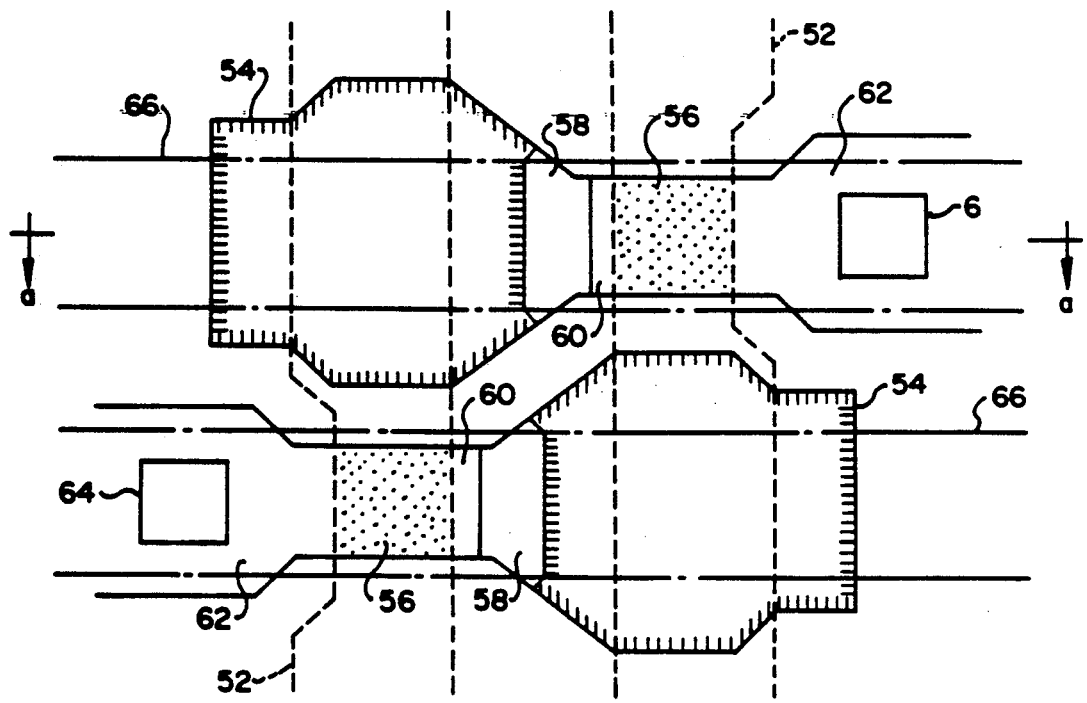
FIG. 2 shows the layout of 1 transistor cell array.

FIG. 2 shows the layout on the chip of the above circuit diagram of FIG. 1.

The transistor Q in the FIG. 1 is a NMOS transistor.

The bit line B is connected to the drain D of the transistor Q and the word line W to the gate G, the source S to the storage capacitor C and the other electrode of the capacitor C is connected to the silicon substrate.

FIG. 2 shows the layout of FIG. 1 and the word line W in FIG. 1 corresponds to a second polysilicon strip 52 in FIG. 2, bit line B to a metal strip 66 composed of Al.

In the storage capacitor of the region 54 the first polysilicon is formed and the region 60 represents the N+ source implanted with N type dopant. This source region 60 is connected to the capacitor electrode which is placed under the first polysilicon formation region 54 through the first and second conduction layer of this invention under the minifield oxidation layer 58.

The region 62 is the drain region implanted with N type dopant and the region 56 represents the gate and gate oxide formed under said second polysilicon and under this oxidation layer the channel is formed. The window 64 is the metal-silicon contact region for the drain and the bit line.

In the FIG. 3A-H, the cross section of a—a line in FIG. 2 is shown with the fabricating step.

The starting material is the silicon wafer with p-type, <100> surface, 4 inch diameter, doping concentration of $7 \times 10^{14} - 3 \times 10^{15}/cm^3$. In the FIGS. 3A-H, the fabricating step of only 1 cell is shown.

Figure 3A:
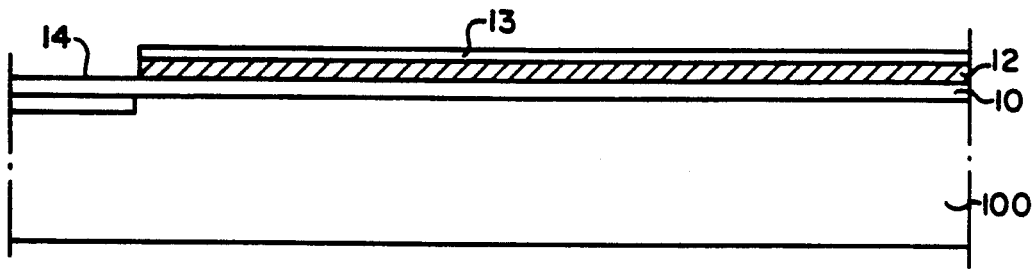
FIG. 3 A-H show the fabricating process diagram of the 1 transistor cell of this invention.
Figure 3B:
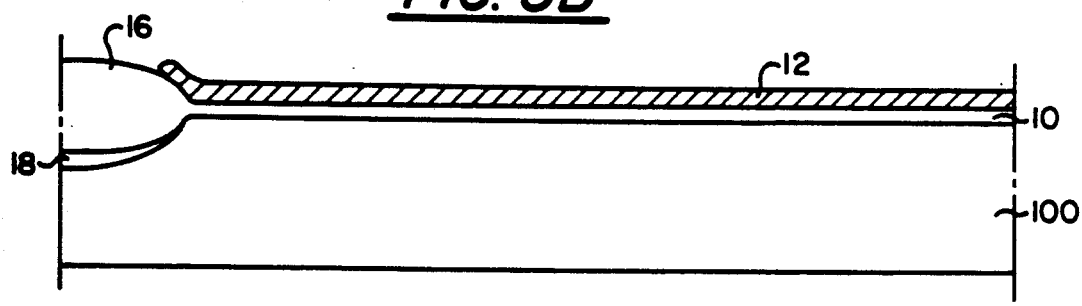
Figure 3C:
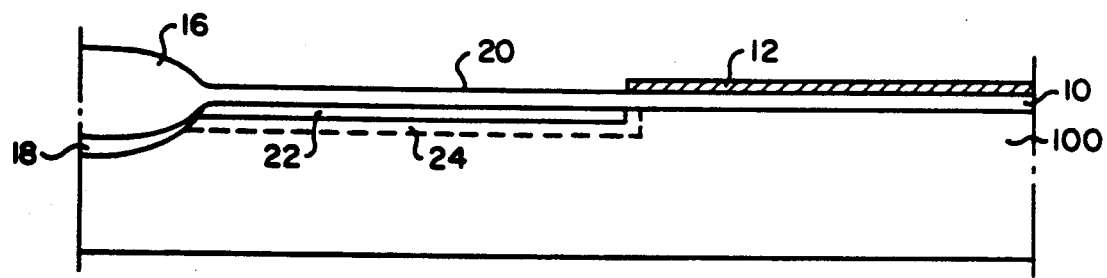

As FIG. 3A shows, a p-type silicon wafer <100> is cleaned and thermally oxidized with 400Å an initial silicon oxide 10. On the oxide 10, the $Si_3N_4$ layer about 1,000Å thickness 12 is formed in a $SiH_2Cl_2$ (dichlorosilane) and $NH_3$ ambient. A photoresist (PR) 13 is coated on the $Si_3N_4$ 12. The PR 13 is exposed to UV through a mask having thick field oxide 16 and P+ channel stop 18 patterns and the PR is developed. The $Si_3N_4$ 12 is etched to expose $SiO_2$ layer 10. Boron is implanted with PR 13 and $Si_3N_4$ 12 as an implantation mask in the region 14. Said PR 13 is removed and the field oxide 16 is grown at 900° C.-1000° C. in a steam or oxidizing ambient as shown in FIG. 3B. During this time the oxide 10 is now grown under the masking of the $Si_3N_4$ 12. As shown in FIG. 3C, the storage capacitor and the minifield oxidation region are defined using photolithography, the $Si_3N_4$ in region 20 is etched to expose the oxide layer.

Arsenic with 40 KeV and $10^{14}/cm^2$ dose is implanted and P(phosphorus) with 30-50 KeV and $10^{13}/cm^2$ dose is implanted to form the As implanted layer 22 and P implanted layer 24. In this process, the As is implanted before the P, but the opposite order of implantation (phosphorus) can also form the said layer 22 and 24.

A first polysilicon is deposited on the cell shown in FIG. 3C. Said polysilicon is deposited conventionally with a thickness of 3,500-4,000Å. The sheet resistance is adjusted to 50-70 ohm/sqr. with ion implantation by N+ diffusion. With photolithography, the first polysilicon is patterned and etched away forming the area for the storage capacitor electrode 26 of the cell array and minifield oxidation region 28 as shown in FIG. 3D.

Figure 3D:
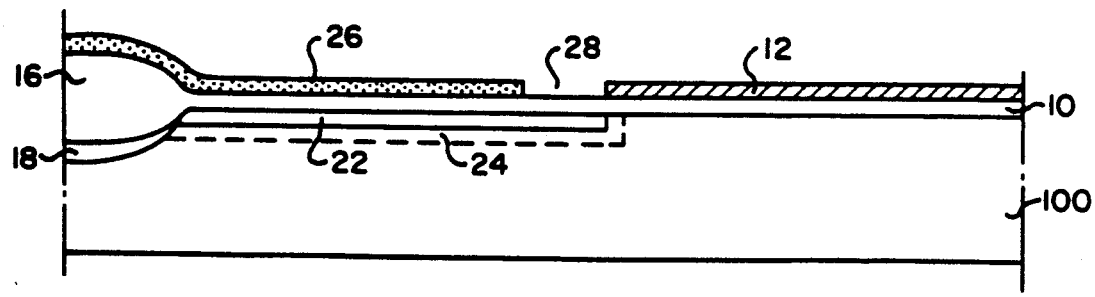
Figure 3E:
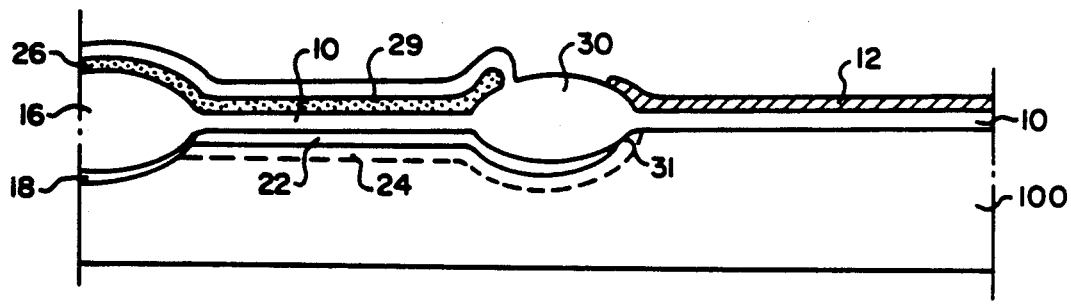
Figure 3F:
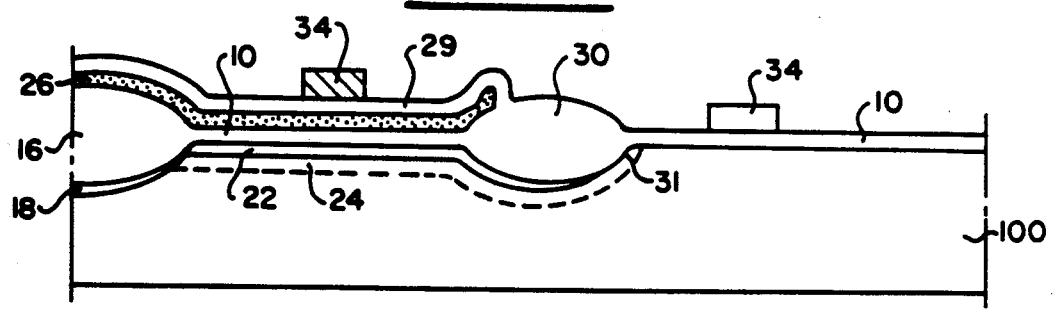
Figure 3G:
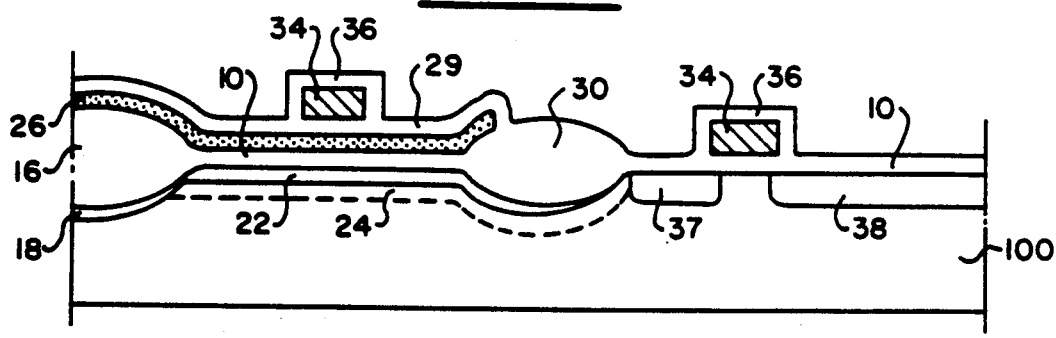
Figure 3H:
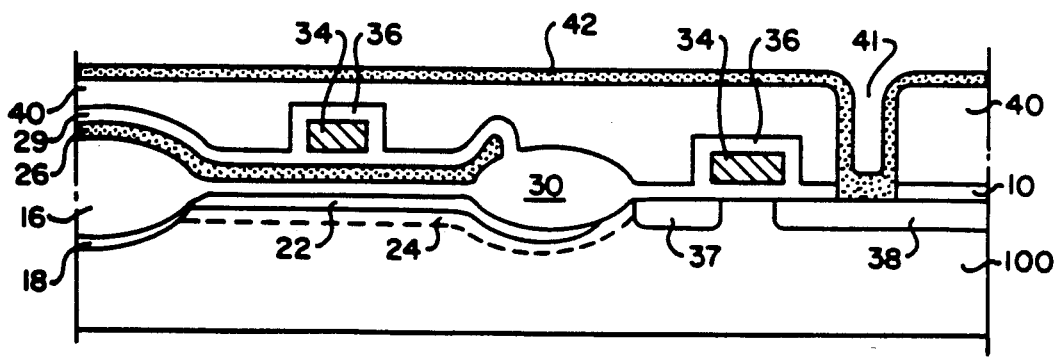

The first polysilicon layer 26 is thermally oxidized at 900°–1,000° C. with a 2,500–4,000Å oxide thickness 29, and the region 28 in FIG. 3D is oxidized with a 2,500–4,000Å thickness 30 as shown in FIG. 3E. The implanted As and P under the minifield oxide 30 are annealed and diffused during said thermal oxidation. Because the diffusivity of the As is less than ½ of that of P, the P diffuses laterally over the bird beak of the minifield oxide 30. When only the As is implanted, as is done conventionally, the lateral diffusion may not be sufficient to reach point 31 during the first polysilicon oxidation, and a decrease of the doping concentration due to the out diffusion of the As produces a large resistance between the source of the MOS transistor (as shown later) and the diffusion layer and at worst, there is a disconnection between them. But, as mentioned before, implantation of the N-type impurity P which has higher diffusivity than that of As can eliminate the above problems.

The $Si_3N_4$ layer 12 in FIG. 3E is etched out away. To adjust the theshold voltage of the enhancement MOS transistor, boron is implanted on the entire surface and, to adjust the threshold voltage of the depletion MOS transistor, P or As is implanted. A second polysilicon is deposited conventionally as stated, in which the gate electrode and the word line 34 is patterned by etching with photolithography as in FIG. 3F.

The As is implanted for the source and drain, and thermal oxide layer 36 is formed on the second polysilicon which forms the gate electrode and word line 34. The implanted As is diffused to form the source 37 and drain 38 as in FIG. 3G.

A phosphosilicate glass or boron-phosphosilicate glass is deposited conventionally to form protection layer 40 and a window 41 is opened to form a contact for a Al bit line 42.

As mentioned previously, this invention uses implantation of the As and another same type impurity which has the higher diffusivity than that of As on the silicon surface under the storage capacitor. Therefore, the lateral diffusion of the high diffusivity impurity during the first polysilicon oxidation connects the source and the implanted layer successfully and reduces the resistance under the minifield layer, which results in the advantages of a large supply voltage margin in DRAM and an increase of the refresh time.

It will be understood by those skilled in the art that the foregoing and other modifications and substitutions may be made to the described embodiment without departing from the spirit and scope of the present invention.

What is claimed is:

1. A method for fabricating a DRAM cell on a semiconductor body employing a lightly doped drain process comprising the steps of:
   forming a masking layer on a surface of the semiconductor body;
   defining an opening in the masking layer;
   implanting a first dopant of a first conductivity type into the opening defined in the masking layer;
   implanting a second dopant of the same conductivity type into the opening defined in the masking layer, the second dopant having a diffusivity greater than the diffusivity of the first dopant;
   depositing a polysilicon layer over a substantial portion of the opening defined in the masking layer;
   heating the semiconductor body in the presence of oxygen to oxidize an upper portion of the polysilicon layer to form a second silicon oxide layer, said heating causing the first and the second dopants to laterally diffuse;
   forming the source and drain regions of a MOS transistor, said source region of said MOS transistor being spaced-apart from and electrically connected with at least said second laterally diffused dopant;
   depositing a second polysilicon on the semiconductor surface to form the gate electrode and word line of a DRAM cell;
   passivating the surface of the semiconductor body to electrically insulate the capacitor and the transistor; and depositing a metal layer to form the bit line of a DRAM cell.

2. The method of claim 1 wherein the first and the second dopant are of the N conductivity type.

3. The method of claim 2 wherein the first dopant is arsenic and the second dopant is phosphorous.

4. A method for fabricating a DRAM cell on a semiconductor body employing a lightly doped drain process comprising the steps of:
   forming a first silicon oxide layer on a surface of the semiconductor body;
   forming a silicon nitride layer on the first silicon oxide layer;
   defining a first opening in the silicon nitride layer;
   oxidizing the semiconductor body to form a thick field oxide in the opening defined in the silicon nitride;
   defining a second opening in the silicon nitride layer for formation of a capacitor electrode;
   depositing a first dopant of a first conductivity type into the second opening defined in the silicon nitride;
   depositing a second dopant of the same conductivity type into the second opening defined in the silicon nitride, the second dopant having a diffusivity greater than the diffusivity of the first dopant, the first and the second dopants co-extensively underlying the second opening;
   depositing a polysilicon layer over a substantial portion of the second opening defined in the silicon nitride leaving a portion of the second opening in the silicon nitride uncovered;
   heating the semiconductor body in the presence of oxygen to form an insulating layer on the polysilicon layer and form a silicon oxide region in the second opening in the silicon nitride not covered by said polysilicon, said heating causing lateral diffusion of said first and said second dopant;
   removing the remaining silicon nitride layer;
   forming the source and drain regions of a MOS transistor, said source region of said MOS transistor being spaced-apart from and electrically connected with at least said second laterally diffused dopant, the second laterally diffused dopant extending under the silicon oxide formed in the region of the second opening not covered by polysilicon;
   depositing a second polysilicon layer on the semiconductor surface to form the gate electrode and word line of a DRAM cell;
   passivating the surface of the semiconductor body to insulate the capacitor and the transistor; and
   depositing a metal layer to form the bit line of a DRAM cell.

5. The method of claim 4 wherein the deposition of the dopants is by ion implantation.

6. The method of claim 4 wherein the first and the second dopant are of the N conductivity type.

7. The method of claim 6 wherein the first dopant is arsenic and the second dopant is phosphorous.

8. The method of claim 4 wherein the metal layer is aluminum.

* * * * *